(12) United States Patent
Zeller

(10) Patent No.: US 8,175,214 B2
(45) Date of Patent: May 8, 2012

(54) PROGRAMMABLE FREQUENCY DIVIDER COMPRISING A SHIFT REGISTER AND ELECTRICAL SYSTEM COMPRISING THE FREQUENCY DIVIDER

(75) Inventor: Sebastian Zeller, Grasbrunn (DE)

(73) Assignee: STMicroelectronics Design & Application GmbH, Grassbrunn (DE)

( * ) Notice: Subject to any disclaimer, the term of this patent is extended or adjusted under 35 U.S.C. 154(b) by 55 days.

(21) Appl. No.: 12/610,105

(22) Filed: Oct. 30, 2009

(65) Prior Publication Data
US 2011/0103541 A1    May 5, 2011

(51) Int. Cl.
*H03K 21/00* (2006.01)
(52) U.S. Cl. ............. 377/47; 377/48; 327/115; 327/117
(58) Field of Classification Search .................. None
See application file for complete search history.

(56) References Cited

U.S. PATENT DOCUMENTS

| | | | | |
|---|---|---|---|---|
| 4,443,887 A * | 4/1984 | Shiramizu | ................. | 377/110 |
| 4,814,962 A | 3/1989 | Magalhaes et al. | | |
| 6,282,255 B1 * | 8/2001 | La Rosa et al. | ................. | 377/47 |
| 6,522,711 B2 * | 2/2003 | Wakada et al. | ................. | 377/48 |
| 6,760,397 B2 * | 7/2004 | Wu et al. | ................. | 377/47 |
| 6,970,025 B2 * | 11/2005 | Magoon et al. | ................. | 327/115 |
| 7,379,522 B2 * | 5/2008 | Narathong et al. | ................. | 377/47 |
| 2002/0186808 A1 * | 12/2002 | Kouznetsov et al. | ................. | 377/47 |
| 2004/0202275 A1 * | 10/2004 | Wang | ................. | 377/47 |
| 2006/0280278 A1 | 12/2006 | Schabel et al. | | |
| 2009/0207635 A1 | 8/2009 | Elferich | | |
| 2009/0213980 A1 * | 8/2009 | Ding et al. | ................. | 377/48 |

OTHER PUBLICATIONS

Miftakhutdinov, R., "Power Saving Control Strategies and Their Implementation in DC/DC Converter for Data and Telecommunication Power Supply," Twenty-Fifth Annual IEEE Applied Power Electronics Conference and Exposition (APEC), Palm Springs, CA, US, pp. 1897-1903, Feb. 21-25, 2010.
Wu, L-M et al., "A Half Bridge Flyback Converter with ZVS and ZCS Operations," The 7th International Conference on Power Electronics, EXCO, Daegu, Korea, pp. 876-882, Oct. 22-26, 2007.

* cited by examiner

*Primary Examiner* — Tuan T Lam
(74) *Attorney, Agent, or Firm* — Seed IP Law Group PLLC

(57) ABSTRACT

A frequency divider having a plurality of programmable latches connected in a feedback shift register configuration. A programmable latch of said plurality of latches comprises a program input to receive a program signal configured to select a polarity of the programmable latch among two opposite polarities. The frequency divider having a configuration module structured to provide at least the program signal to the program input to modify a divisor parameter of the frequency divider.

23 Claims, 5 Drawing Sheets

PROGRAMMABLE FREQUENCY DIVIDER COMPRISING A SHIFT REGISTER AND ELECTRICAL SYSTEM COMPRISING THE FREQUENCY DIVIDER

BACKGROUND

1. Technical Field

The present disclosure relates to shift registers and to frequency dividers comprising shift registers.

2. Description of the Related Art

U.S. Patent Application Publication No. 2006/0280278 describes a frequency divider circuit which has a chain of flip-flops that are connected by a feedback path to a feedback shift register. This document discloses a flip-flop formed by two latches comprising a cascaded differential stage.

In accordance with a prior art technique, in order to make the feedback shift register programmable, it is necessary to change the number of flip-flops in the shift register loop. This is currently made by using a multiplexer structured to select the flip flop where the feedback signal is taken from. It is observed that if multiphase clocks with constant phase shift have to be generated, additional multiplexers are needed to adjust the tap of the individual outputs to the programmed divisor.

BRIEF SUMMARY

The programmable frequency dividers of the prior art techniques show signal propagation delays associated with the employed multiplexers which make it difficult to get precise multiphase output clocks.

According to an embodiment, a frequency divider is provided which comprises a plurality of programmable latches connected in a feedback shift register configuration; a programmable latch of said plurality of latches comprises: a program input to receive a program signal configured to select a polarity of the programmable latch among two opposite polarities; a control terminal to receive a clock signal setting the behavior of the programmable latch in accordance with a selected polarity. The frequency divider further includes a configuration module structured to provide at least the program signal to the program input to modify a divisor parameter of the frequency divider.

According to another embodiment an electrical system is provided that comprises a frequency divider comprising an input for a clock signal; a plurality of programmable latches connected in a feedback shift register configuration and structured to assume different polarities according to a selectable divisor parameter of the frequency divider; an output for an output signal having a frequency equal to a frequency of the clock signal divided by said divisor parameter; an apparatus having an input terminal to receive said output signal.

An embodiment of a feedback shift register is defined to include at least a programmable latch having a program input to receive a program signal configured to select a polarity of the at least the programmable latch among two opposite polarities; and a control terminal to receive a clock signal setting the behavior of the at least the programmable latch in accordance with the selected polarity.

These and other aspects will be apparent from and elucidated with reference to the embodiments described hereinafter.

BRIEF DESCRIPTION OF THE SEVERAL VIEWS OF THE DRAWINGS

Further characteristics and advantages will be more apparent from the following description of a preferred embodiment and of its alternatives given as an example with reference to the enclosed drawings in which.

DETAILED DESCRIPTION

Figure 1:
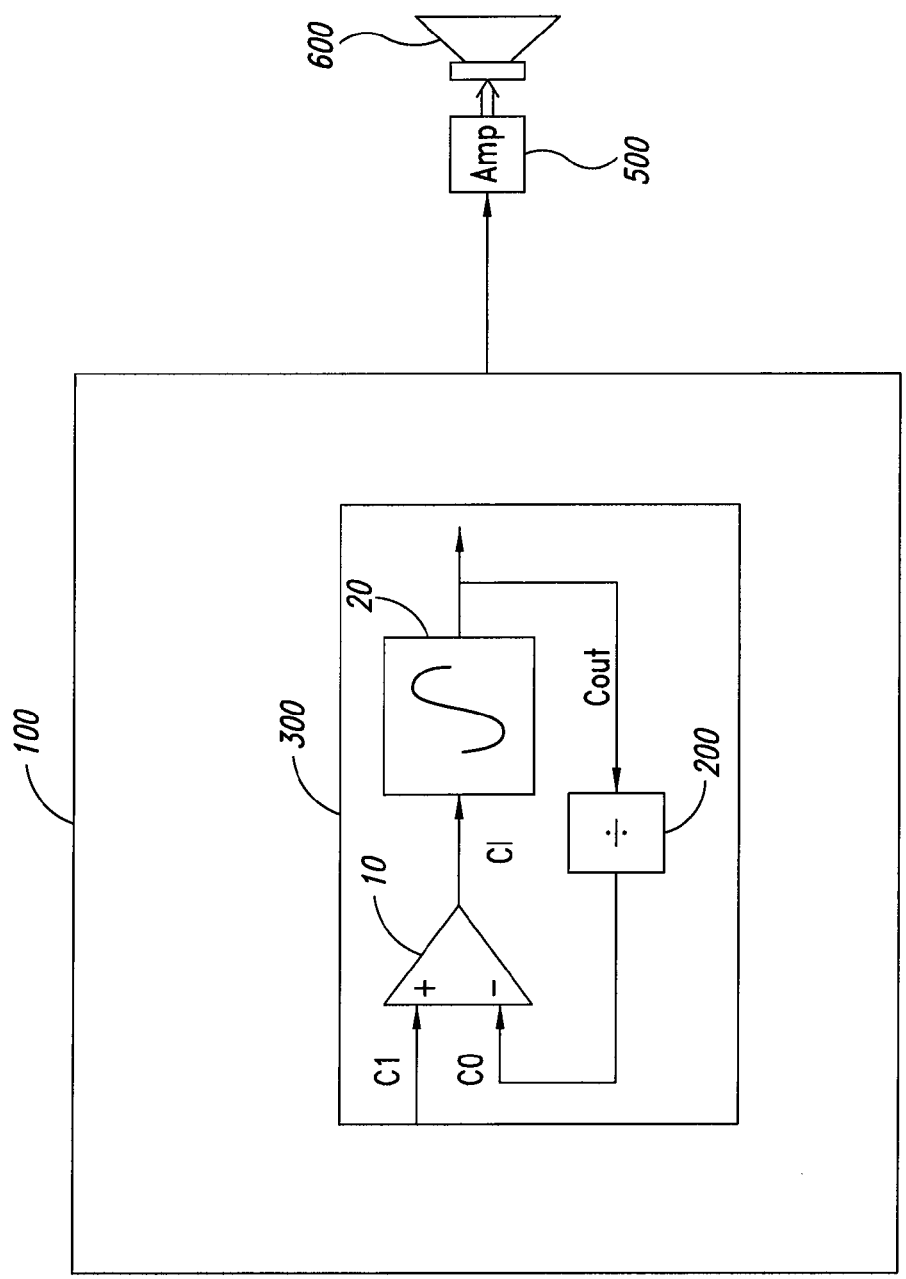
FIG. 1 schematically illustrates an electrical system comprising a phase-locked loop utilizing a frequency divider in accordance with the present disclosure.

FIG. 1 schematically shows an electrical system 100 comprising an apparatus 300. As an example, the electrical system 100 is a radio tuner structured to receive radio broadcasts and convert them into audio-frequency signals which can be fed into an amplifier 500 driving a loudspeaker 600. Particularly, the radio tuner 100 can be a highly integrated tuner which deals with transmissions using different methods of modulation or transmissions techniques, such as: FM (Frequency Modulation), AM (Amplitude Modulation) and Digital Audio Broadcasting (DAB). In accordance with a particular example, the radio tuner 100 can be installed in a vehicle (e.g. a car) radio device.

According to an embodiment, the apparatus 300 is a phase-locked loop (PLL). The phase-locked loop 300 schematically shown in FIG. 1 includes a phase detector 10, a voltage-controlled oscillator 20, and a feedback branch including a frequency divider 200. The phase detector 10 compares the frequencies of two signals C1 and C0 and produces an error signal Ce which is proportional to the difference between the input frequencies. The error signal Ce (which can be, as an example, low-pass filtered) is used to drive the voltage-controlled oscillator 20 which creates a controlled output signal Cout. The controlled output signal Cout is fed through the frequency divider 200 back to the input of the system 300, producing a negative feedback loop.

Figure 2:
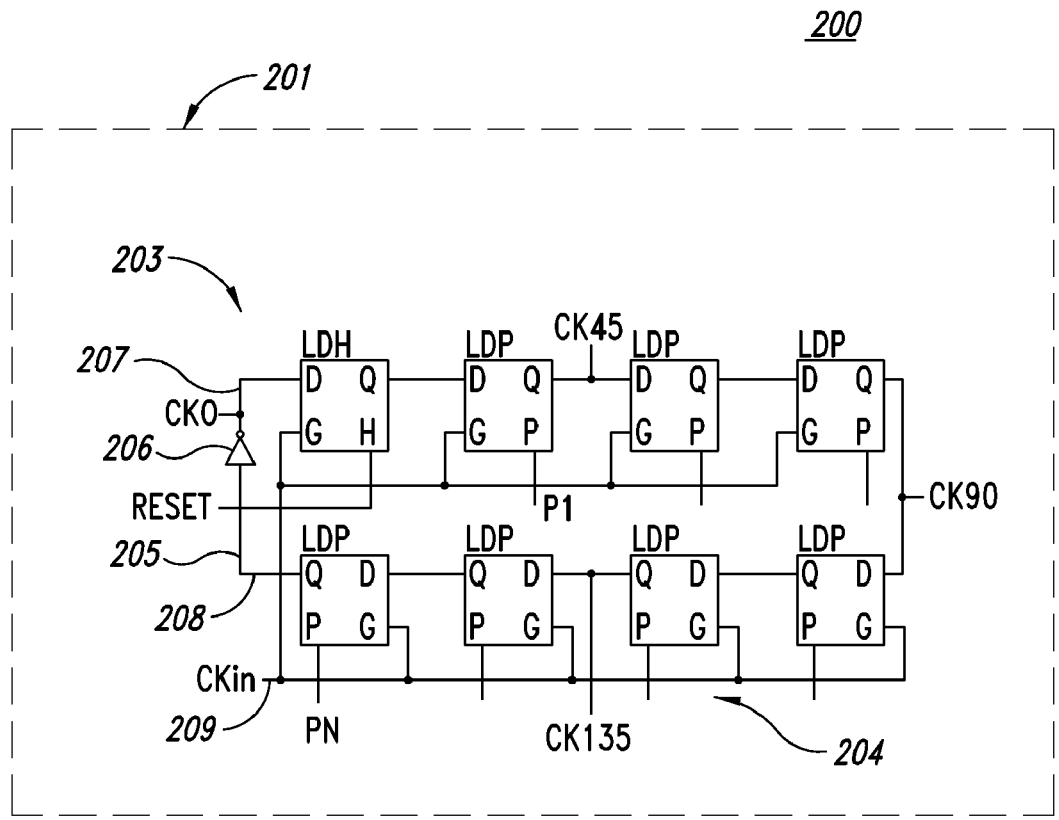
FIG. 2 shows an embodiment of a frequency divider employable by the electrical system.
Figure 2:
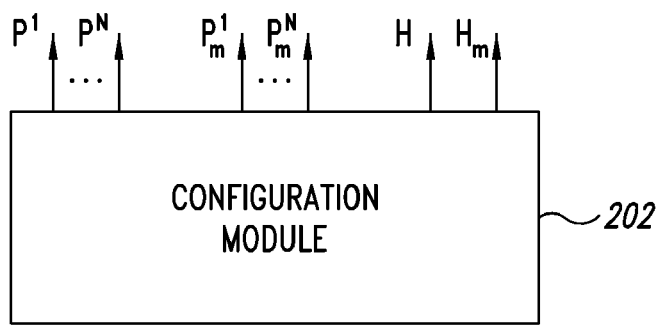

FIG. 2 shows an embodiment of the frequency divider 200 including a feedback shift register 201 and a configuration module 202. The feedback shift register 201 comprises a latches chain 203 and a feedback latches chain 204 connected by a feedback branch 205, provided by an inverter 206, to the latches chain 203. An input 207 of the latches chain 203 is connected to an output port of the inverter 206 having a respective input port connected to an output 208 of the feedback latches chain 204. As known to the skilled man a latch is a kind of bistable multivibrator having two stable states and thereby can store one bit of information (1 or 0).

The feedback shift register 201 is provided with an input 209 for a input clock signal CKin to be submitted to a frequency division according to a divisor parameter associated with the frequency divider 200. In accordance with the embodiment illustrated in FIG. 1, the input clock signal CKin is the controlled output signal Cout exiting the voltage-controlled oscillator 20. According to the embodiment of FIG. 2, the feedback shift register 201 comprises a first output tap CK0 for an output signal, hereinafter also indicated as CK0, which shows a frequency obtained by dividing the frequency of the input clock signal CKin by the divisor parameter.

In accordance with another embodiment, the frequency divider 200 is a multiphase divider and, as an example, further comprises a second output tap CK45, a third output tap CK90 and at least a fourth output tap CK135. The output taps CK45, CK 90, . . . CK135 provide respective output signals having the same frequency of the output signal CK0 but showing different phase shifts.

Particularly, the latches chain 203 includes an initialization latch LDH which is, e.g. a D latch provided with a first signal input D connected to the input 207, a first signal output Q, a first control input G and a hold input H. The hold input can receive a RESET signal and the control input G is adapted to receive the input clock signal CKin.

Both latches chain 203 and feedback latches chain 204 include a plurality of programmable latches LDP which are, as an example, D latches. Each programmable latch LDP can be programmed to assume selectively a first polarity and a second polarity. The polarity of a latch indicates the behavior of the latch with respect to the level (0 or 1) assumed by its control or gate signal.

In greater detail and with reference to the particular case of D latches, each LDP latch is provided with at least a signal input D, a signal output Q, a control or gate input G and a program input P. As an example, according to the first polarity (P=1) when the control input G is 0 (low level), the current value at the signal input D has no effect on the signal output Q and the value at the signal output Q is the value which was present at the signal input D before the value at the control input G changed from 1 to 0. When control input G is 1 (high level), the signal output Q equals the current value at the signal input D. On the contrary, according to the second polarity (P=0), when the control input G is 1 (high level), the current value at the signal input D has no effect on the signal output Q and the value at the signal output Q is the value which was present at the signal input D before the value at the control input G changed from 0 to 1. When control input G is 0 (low level), the signal output Q equals the current value at the signal input D.

A respective programming signal provided at the program input P of each programmable latches LDP allows to selectively set up the first polarity or the second polarity of each programmable latch LDP in accordance with a desired divisor parameter chosen for the frequency divider 200.

The programmable latches LDP and the initialization latch LDH of the latches chain 203 and the ones of the feedback latches chain 204 are connected in a shift register configuration and each signal output Q is connected to the signal input D of the subsequent latch LDP. The signal output Q of the LDP latch connected to the feedback branch 205 is coupled to the input port of the inverter 206. Moreover, the input clock signal CKin is supplied to any control input G of the programmable latches LDP and any programming signals provided at the program inputs P are generated by the configuration module 202.

Figure 3:
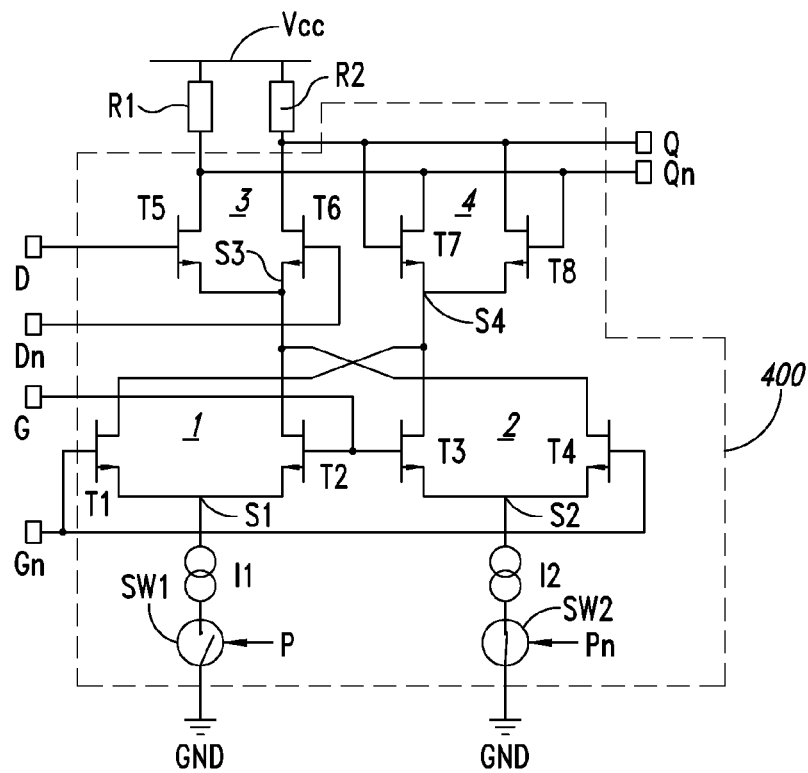
FIG. 3 shows an embodiment of a programmable latch employable by the frequency divider.

The initialization latch LDH and the programmable latches LDP can be realized, particularly, in CMOS, CML (Current Mode Logic) and ECL (Emitter Coupled Logic) technology. FIG. 3 shows the structure of a CML programmable latch LDP made in accordance with an example and including a cascade differential amplifier 400. Complementary signal input Dn, complementary signal output Qn, complementary control input Gn and complementary program input Pn are also shown in FIG. 3. The cascade differential amplifier 400 comprises a first control differential stage 1, a second control differential stage 2, an input differential stage 3 and an output differential stage 4. Particularly, the first control differential stage 1, the second control differential stage 2, the input differential stage 3 and the output differential stage 4 are realized as differential amplifiers, i.e. differential pairs.

The first and the second control differential stages 1 and 2 are electrically coupled to the control input G and to the complementary control input Gn. Moreover, the first and the second control differential stages 1 and 2 are configured to be selectively enabled/disabled by the program signal P and by the complementary program signal Pn, respectively. The first control differential stage 1 is connected to the input and output differential stages 3 and 4 according to a first electrical circuital linking which is associated with the first polarity. The second control differential stage 2 is connected to the input and output differential stages 3 and 4 according to a second electrical circuital linking which is associated with the second polarity.

In greater detail, the first control differential stage 1 comprises a first transistor T1 and a second transistor T2; the second control differential stage 2 comprises a third transistor T3 and a fourth transistor T4; the input differential stage 3 comprises a fifth transistor T5 and sixth transistor T6; the output differential stage 4 comprises a seventh transistor T7 and an eighth transistor T8. The particular transistors T1-T8 of the differential stages 1-4 shown in FIG. 3 are n-channel transistors.

Source terminals S1 of the first and second transistors T1 and T2 are connected to a first current generator I1 having a terminal connectable/disconnectable to/from a ground terminal GND by means of a first switch SW1 activated by the programming signal at the programming input P. A gate terminal of the first transistor T1 is connected to the complementary control input Gn while a gate terminal of the second transistor T2 is connected the control input G.

Source terminals S2 of the third and fourth transistors T3 and T4 are connected to a second current generator I2 having a terminal connectable/disconnectable to/from the ground terminal GND by means of a second switch SW2 activated by a complementary programming signal at the complementary programming input Pn. A gate terminal of the third transistor T3 is connected to the control input G while a gate terminal of the fourth transistor T4 is connected the complementary control input Gn.

A drain terminal of the fifth transistor T5 is connected to a first bias load R1 (e.g. a resistor) and drain terminal of the sixth transistor T6 is connected to second bias load (e.g. a resistor) R2. The first and second bias loads R1 and R2 are connected to a supply voltage terminal Vcc. A gate terminal of the fifth transistor T5 is connected to the signal input D while a gate terminal of the sixth transistor T6 is connected the complementary signal input Dn. Source terminals S3 of the fifth and sixth transistors T5 and T6 are connected to a drain terminal of the second transistor T2.

A drain terminal of the seventh transistor T7 is connected to the drain terminal of the fifth transistor T5 to form the complementary signal output Qn which is also connected to the gate terminal of the eighth transistor T8. A drain terminal of the eighth transistor T8 is connected to the drain terminal of the sixth transistor T6 to form the signal output Q which is also connected to the gate terminal of the seventh transistor T7. Source terminals S4 of the seventh and eighth transistors T7 and T8 are connected to a drain terminal of the third transistor T3.

A drain terminal of the first transistor T1 is connected to the source terminals S4 of the seventh and eighth transistors T7 and T8 and a drain terminal of the fourth transistor T4 is connected to the source terminals of the fifth and sixth transistors T5 and T6.

With reference to the operation of the programmable latch LDP, it has to be noticed that program signals at the program input P and the complementary program input Pn allow selecting the polarity of the programmable latch LDP by selectively enabling or disabling the first and second control differential stages 1 and 2. In greater detail, when the signal at the program input P shows a high level (P=1) and the signal at the complementary program input Pn shows a low level (Pn=0) the first polarity is selected.

According to an example of operation, when the program signal P is equal to 1 (Pn=0) the programmable latch LDP operates as a standard D latch. In this case, the first switch SW1 is closed and the input differential stage 1 of the programmable latch LDP is fed by the current provided by the first current generator I1 while the second switch SW2 is opened and the input differential stage 2 is disabled as it receives no current from the second current generator I2. Particularly, the third transistor T3 and the fourth transistor T4 are disabled.

If at the control input G a high level is fed (G=1), the second transistor T2 is enabled while the first transistor T1 is disabled (Gn=0). For an input signal D=1 (Dn=0), the fifth transistor T5 is enabled while the sixth transistor T6 is disabled. The disabled status of the sixth transistor T6 and the first transistor T1 does not allow circulation of a current in the second load R2, and therefore there is no voltage drop on the second load R2, causing a high level signal at the signal output Q (Q=1). The first load R1 is connected to the first current generator I1 by a path including the fifth transistor T5 and the second transistor T2, and therefore at the complementary output Qn a low level is provided (Qn=0). It is clear to the skilled man from the above description that by maintaining P=1, G=1 and setting D=0 the signal output Q will assume the same value of the signal input D, in accordance with the first polarity behavior.

If at the control input G a low level is fed (G=0) the second transistor T2 is disabled while the first transistor T1 is enabled (Gn=1). In this way the seventh transistor T7 and the eighth transistor T8 are connected to the first current generator I1 via the first transistor T1, while the fifth transistor T5 and the sixth transistor T6 are disabled as there is no current supplied via the disabled second transistor T2. Due to the positive feedback of the seventh transistor T7 and the eighth transistor T8 (i.e. the gate of the seventh transistor T7 is connected to the drain of the eighth transistor T8 and vice versa) the state of the output signal Q is determined by the state of the input signal D at the moment when the control input G changed its state from 1 to 0 and will be preserved as long as the control input G remains 0.

On the contrary, if the program input P is equal to 0 and the complementary program input Pn is equal to 1, the second polarity is assumed. In this situation (second polarity)) the programmable latch LDP operates as a standard D latch with inverted polarity of its control input G. In this case, the second switch SW2 is closed and the input differential stage 2 of the programmable latch LDP is fed by the current provided by the second current generator I2 while the first switch SW1 is opened and the input differential stage 1 is disabled as it receives no current from the first current generator I1.

Reference is now made to an example of the second polarity behavior in which, P=0 (Pn=1) and G=0 (Gn=1). In these conditions the fourth transistor T4 is enabled while the third transistor T3 is disabled. For an input signal D=1 (Dn=0), the fifth transistor T5 is enabled while the sixth transistor T6 is disabled. The disabled status of the sixth transistor T6 and the third transistor T3 does not allow circulation of a current in the second load R2 and therefore there is no voltage drop on the second load R2, causing a high level signal at the signal output Q (Q=1). The first load R1 is connected to the second current generator I2 by a path including the fifth transistor T5 and the fourth transistor T4, and therefore at the complementary output Qn a low level is provided (Qn=0). It is clear to the skilled man from the above description that by maintaining P=0, G=0 and setting D=0 the signal output Q will assume the same value of the signal input D, in accordance with the first polarity behavior.

If at the control input G a high level is fed (G=1) the fourth transistor T4 is disabled while the third transistor T3 is enabled (Gn=0). In this way the seventh transistor T7 and the eighth transistor T8 are connected to the second current source I2 via the third transistor T3, while the fifth transistor T5 and the sixth transistor T6 are disabled as there is no current supplied via the disabled fourth transistor T4. Due to the positive feedback of the seventh transistor T7 and the eighth transistor T8 (i.e. the gate of the seventh transistor T7 is connected to the drain of the eighth transistor T8 and vice versa) the state of the output signal Q is determined by the state of the input signal D at the moment when the control input G changed its state from 0 to 1 and will be preserved as long as the control input G remains 1.

Figure 4:
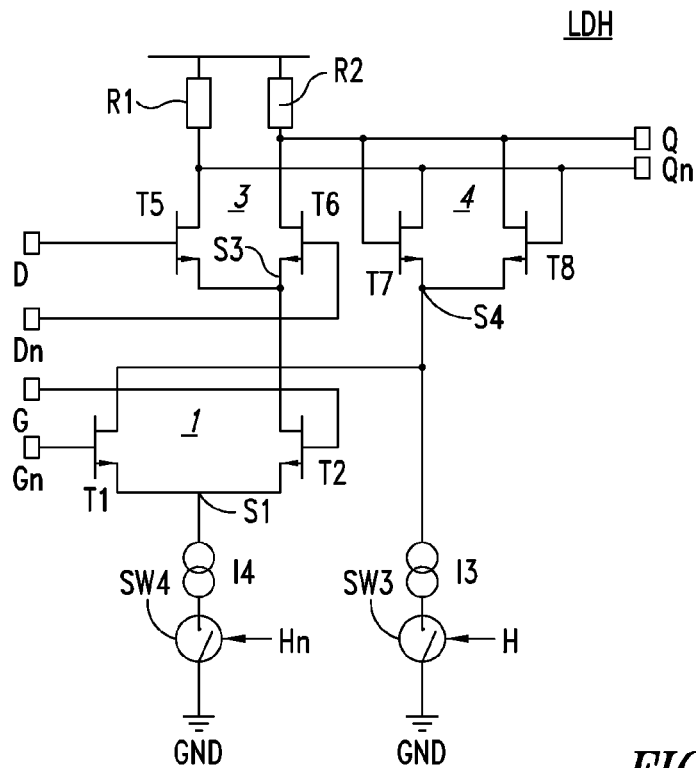
FIG. 4 shows an embodiment of another latch employable by the frequency divider.

FIG. 4 shows an example of the initialization latch LDH which is structurally analogous to the programmable latch LDP shown in FIG. 3 apart from the fact that the initialization latch LDH is not provided with the second control differential stage 2 but the source terminals S4 of the output differential stage 4 are directly connected to a third current generator I3. The third current generator I3 is connectable/disconnectable to/from the ground terminal GND by a third switch SW3 driven by a program hold signal H.

Moreover, the source terminals S1 of the first and second transistors T1 and T2 are connected to a fourth current generator I4 connectable/disconnectable to/from the ground terminal GND by a fourth switch SW4 driven by a complementary program hold signal Hn. It is noticed that both initialization latch LDH and programmable latches LDP can be made in bipolar technology and not exclusively in MOS technology.

According to an example of operation, when the program hold signal H is equal to 0 (Hn=1) the initialization latch LDH operates as a standard D latch. In this case, the fourth switch SW4 is closed and the input differential stage 1 of the initialization latch LDH is fed by the current provided by the fourth current generator I4 while the third switch SW3 is opened.

In the opposite situation, the program hold signal H is equal to 1 (Hn=0) and the output differential stage 4 is always enabled while the first control differential stage 1 is always disabled. In this condition, the signal outputs Q and Qn are fixed to a corresponding previously memorized value and any changes at the signal inputs D and Dn and at the control input G, Gn has no effect on the signal outputs Q and Qn.

With reference again to FIG. 2, the configuration module 202 is structured to generate a plurality of program signals $P^1 \ldots P^N$ (and the complementary signals $P_n^1 \ldots P_n^N$) to be supplied to the programmable latches LDP, and the hold program signal H (and its complementary signal Hn) to be supplied to the initialization latch LDH. The configuration module 202 can include a suitable software and/or a logic circuit configured to allow programming of the frequency divider. It is observed that two consecutive programmable latches LDP of the frequency divider 200 which are programmed to show opposite polarities behave as a master-slave flip flop while two consecutive programmable latches LDP programmed to show the same polarity behave as a single latch.

In accordance with the example described, the frequency divider 200 can be programmed in accordance with the following method and considerations. The initialization latch LDH can always stay at the same polarity while the polarity of the programmable latches LDP can be changed in accordance with the desired frequency divisor parameter. The desired divisor parameter is given by the total number of 10 (first polarity towards second polarity) and 01 (second polarity towards first polarity) transitions in the polarity sequence of the latches included in the frequency divider 200, which starts with the fixed polarity (P=1) of the input latch LDH in the chain and ends with the polarity of the last programmable latch LDP before the inverter. The divisor parameter increments by one, if the last polarity in the sequence has the value 0, because then an additional 01 transition from the last to the first latch polarity exists.

Moreover, the first M latches (programmable latches LDP and initialization latch LDH) placed between the consecutive signal output taps (e.g. signal first and second output taps CK0 and CK45) have the same polarity configuration, either opposite or identical, as the second M latches placed between the next two consecutive taps (e.g. signal output taps CK45 and CK90), and so on. This symmetry allows obtaining correct clock phases for each programmed divisor parameter.

According to a particular embodiment, the two latches directly before each signal output taps have opposite polarity so that these two latches form a flip flop. This has the effect that the output taps of the frequency divider 200 are always re-clocked by the input clock signal CKin, which minimizes jitter and phase error due to unbalanced propagation delays. Moreover, it is preferable to program the frequency divider 200 so as that the maximum length of a sequence of latches with the same polarity is as small as possible, since this length represents the speed critical path.

With reference to the initial bit pattern of the latches LDH and LDP of the frequency divider 200 it is observed that the configuration module 202 is configured to reset each latch and to provide one of the following suitable initial bit patterns:

00000 . . . 00000, 10000 . . . 00000, 11000 . . . 00000, . . . . . . ,
11111 . . . 1100, 11111 . . . 11110, 11111 . . . 11111, 01111 . . . 11111, . . . , 00111 . . . 11111, . . . ,
00000 . . . 00011, 00000 . . . 00001, 00000 . . . 00000.

As indicate above, in one embodiment only initial patterns which do not include more than one transition 10 or 01 are allowed.

Moreover, the configuration module 202 operates so as to reset the frequency divider 200 by gating the clock (i.e. by fixing the hold input H=1) of the initialization latch LDH so as the initialization latch LDH will stay in its latch state until all other programmable latches LDP have stored the same value. After that, the configuration module 202 releases the first latch LDH (i.e. by setting the hold input H=0) and the frequency divider 200 can start with a proper value. It is observed that the clock gating (i.e. fixing the hold input H=0) does not need to be synchronous with the input clock CKin since regardless at which state the first flip flop in the chain (i.e. the one including the input latch LDH) formed by two or more consecutive latches settles after the reset is released, the bit pattern will always be valid.

Figure 5:
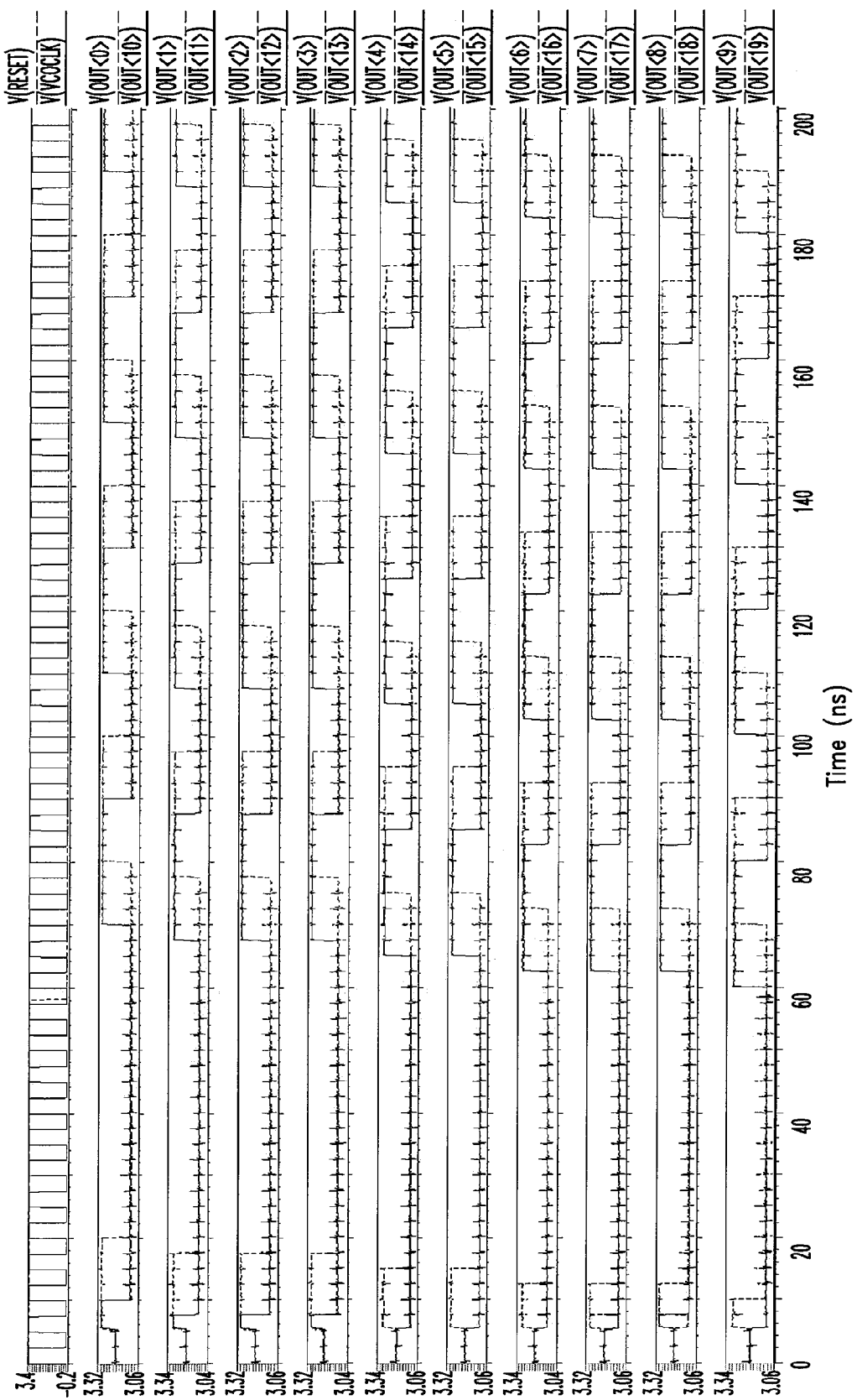
FIGS. 5 and 6 show computer simulation results referring to a frequency divider having a divisor parameter equal to 8 and a frequency divider having a divisor parameter equal to 20, respectively.
Figure 6:
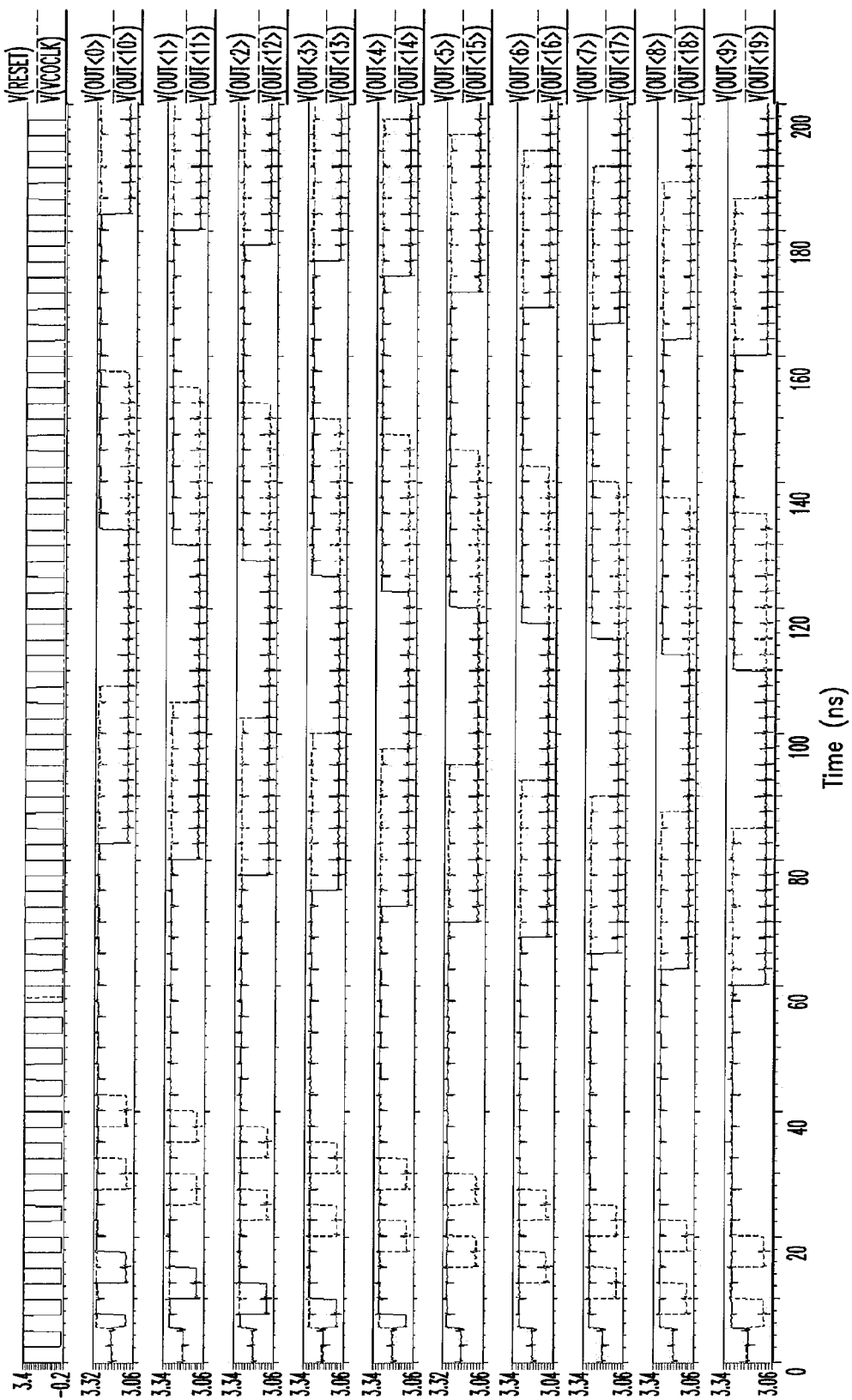

FIGS. 5 and 6 show computer simulation results referring to the frequency divider 200 implemented with nineteen programmable latches LDP and one initialization latch LDH and provided with twenty output taps 0-19. The simulation of FIG. 5 refers to an example in which the divisor parameter DIV is 8 and FIG. 6 refers to another example in which the divisor parameter DIV is 20. FIGS. 5 and 6 show the input voltage VCOCLK corresponding to the input clock signal CKin, the RESET signal and the voltages at the output taps 0-19. It should be noted that this implementation of a frequency divider was used to generate a programmable clock taken from the output of the $10^{th}$ latch (OUT<10>) and a 90° delayed clock taken from the output of the $0^{th}$ latch (OUT<0>). According to the examples shown, the latch indicated in the previous description as initialization latch LDH is placed at the nineteenth position and provide the output voltage indicated in FIGS. 5 and 6 as V(OUT<19>).

With reference to the polarity pattern of the latches, the frequency divider of FIG. 5 (DIV=8) shows the following polarity pattern (latches ordered from 19 position to 0 position):

10001100011000110001

The frequency divider corresponding to the simulation of FIG. 6 (DIV=20) has the following polarity pattern (latches ordered from 19 position to 0 position):

10101010101010101010

Further possible polarity patterns to be assumed by the frequency divider 200, employing twenty latches, to obtain distinct divisor parameters are:

| DIV | polarity of latches 19 . . . 0 |
|-----|-------------------------------|
| 10  | 10001101100111001001          |
| 12  | 10001101101000110110          |
| 14  | 10110010010100110110          |
| 16  | 10110101101011010110          |
| 18  | 10110101010100101010          |

It is observed that the described programmable frequency divider shows a structural complexity reduced or comparable to the frequency divider employing multiplexers made in accordance with the prior art techniques. The programmability of the shift register of the above described frequency divider allows to avoid use of multiplexers for selecting particular latches or flip flops in the shift register. This possibility has the positive effect of increasing precision in the phases of the signal/signals exiting the frequency divider since no different propagation paths causing undesired phase mismatching are introduced. The high precision in the phase signal obtainable by the shift register of the described frequency divider is adapted not only for a phase-lock loop apparatus but also for the following exemplary applications: two phase generator and programmable local oscillator pre-scaler for a complex mixer multi-phase generator and programmable local oscillator pre-scaler for a harmonic reject mixer.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A frequency divider comprising:
a plurality of programmable latches connected in a feedback shift register configuration, the plurality of programmable latches including a first programmable latch that includes a program input to receive a program signal and a control terminal to receive a clock signal, the first programmable latch being configured to select a polarity of the first programmable latch among two opposite polarities based on the program signal, and set the behavior of the first programmable latch in accordance with the selected polarity and the clock signal;

a configuration module structured to provide the program signal to the program input of the first programmable latch to modify a divisor parameter of the frequency divider;

an inverter placed between a sub-plurality of programmable latches of said plurality of programmable latches and a feedback sub-plurality of programmable latches of said plurality of programmable latches; and an input latch having a signal input, a clock input, a hold input, and an output, the signal input being connected to an output of the inverter, the hold input being configured to receive a hold signal from the configuration module, the clock input being configured to receive the clock signal, the output being coupled to a consecutive programmable latch of the sub-plurality of programmable latches, and the input latch being structured to:

hold fixed an output value at the output of the input latch, regardless of the clock signal, in response to receiving a first value of the hold signal, and vary the output value at the output of the input latch according to the clock signal, in response to receiving a second value of the hold signal, wherein said first programmable latch comprises:

an input differential stage connected to a signal input;

an output differential stage connected to a signal output:

a first control differential stage coupled to the control terminal and connected to the in and output differential stages the first control differential stage being configured to be enabled by the program signal in the first polarity and disabled by the program signal in the second polarity, and a second control differential stage coupled to the control terminal and connected to the input and output differential stages, the second control differential stage being configured to be disabled in the first polarity and enabled in the second polarity.

2. The frequency divider of claim 1, wherein said plurality of programmable latches comprises:

a second programmable latch connected to the configuration module, the second programmable latch being configured to assume a polarity opposite to the polarity assumed by the first programmable latch.

3. The frequency divider of claim 1, wherein said first programmable latch further comprises:

a first current generator connected to the first control differential stage;

a first switch device connected to the first current generator and structured to receive the program signal, activate the first current generator in the first polarity, and deactivate the first current generator in the second polarity;

a second current generator connected to the second control differential stage; and a second switch device connected to the second current generator and structured to deactivate the second current generator in the second polarity and activate the second current generator in the second polarity.

4. The frequency divider of claim 1, wherein the programmable latches of the plurality of programmable latches are D latches.

5. The frequency divider of claim 1, wherein the plurality of programmable latches comprises transistors made in accordance with one of the following technologies: bipolar technology, MOS technology, CML technology, ECL technology.

6. The frequency divider of claim 1, wherein:

the configuration module is structured to set a polarity of each latch of the plurality; and the divisor parameter is related to the number of transitions between the polarities shown by the plurality of latches.

7. The frequency divider of claim 1, wherein the configuration module is structured to program the plurality of latches in an initial pattern of stored bits which do not include more than one transition 10 or 01.

8. An electrical system comprising:

a frequency divider including:

an input for a clock signal;

a plurality of programmable latches connected to said input in a feedback shift register configuration and structured to assume different polarities according to a selectable divisor parameter of the frequency divider; and an output for an output signal having a frequency equal to a frequency of the clock signal divided by said divisor parameter; and an apparatus having an input terminal to receive said output signal, wherein the frequency divider includes:

an inverter placed between a sub-plurality of programmable latches of said plurality of programmable latches and a feedback sub-plurality of programmable latches of said plurality of programmable latches; and an input latch having a signal input, a clock input, a hold input, and an output, the signal input being connected to an output of the inverter, the hold input being configured to receive a hold signal, the clock input being configured to receive the clock signal, the output being coupled to a consecutive programmable latch of the plurality of programmable latches, and the input latch being structured to:

hold fixed an output value at the output of the input latch, regardless of the clock signal, in response to receiving a first value of the hold signal, and vary the output value at the output of the input latch according to the clock signal, in response to receiving a second value of the hold signal, wherein:

the frequency divider includes a configuration module structured to provide a program signal to modify the divisor parameter of the frequency divider;

said plurality of programmable latches comprises a first programmable latch that that includes a program input to receive the program signal and a control terminal to receive the clock signal, the first programmable latch being configured to select a polarity of the first programmable latch among two opposite polarities based on the program signal, and set the behavior of the first programmable latch in accordance with the selected polarity and the clock signal; and said first programmable latch comprises:

an input differential stage connected to a signal input;

an output differential stage connected to a signal output;

a first control differential stage coupled to the control terminal and connected to the input and output differential stages. the first control differential stage being configured to be enabled by the program signal in the first polarity and disabled by the program signal in the second polarity; and a second control differential stage coupled to the control terminal and connected to the input and output differential stages, the second control differential stage being configured to be disabled in the first polarity and enabled in the second polarity.

9. The electrical system of claim 8, wherein said system is a radio turner and said apparatus comprises:

a phase detector to receive the output signal of the frequency divider; and a voltage-controlled oscillator producing the clock signal of the frequency divider.

10. The electrical system of claim 8, wherein said plurality of programmable latches comprises:

a second programmable latch connected to the configuration module, the second programmable latch being configured to assume a polarity opposite to the polarity assumed by the first programmable latch.

11. The electrical system of claim 8, wherein said first programmable latch further comprises:

a first current generator connected to the first control differential stage;

a first switch device connected to the first current generator and structured to receive the program signal, activate the first current generator in the first polarity, and deactivate the first current generator in the second polarity;

a second current generator connected to the second control differential stage; and a second switch device connected to the second current generator and structured to deactivate the second current generator in the second polarity and activate the second current generator in the second polarity.

12. A feedback shift register comprising:

a first programmable latch having:
   a program input to receive a program signal; and
   a control terminal to receive a clock signal, the first programmable latch being configured to select a polarity of the first programmable latch among two opposite polarities based on the program signal, and set the behavior of the first programmable latch in accordance with the selected polarity and the clock signal; and an inverter placed between a sub-plurality of programmable latches of said plurality of programmable latches and a feedback sub-plurality of programmable latches of said plurality of programmable latches; and an input latch having a signal input, a clock input, a hold input, and an output, the signal input being connected to an output of the inverter, the hold input being configured to receive a hold signal, the clock input being configured to receive a clock signal, the output being coupled to a data input of the first programmable latch, and the input latch being structured to:
   hold fixed an output value at the output of the input latch, regardless of the clock signal, in response to receiving a first value of the hold signal, and
   vary the output value at the output of the input latch according to the clock signal, in response to receiving a second value of the hold signal, wherein said first programmable latch comprises:
an input differential stage connected to a signal input;
an output differential stage connected to a signal output;
a first control differential stage coupled to the control terminal and connected to the input and output differential stages, the first control differential stage being configured to be enabled by the program signal in the first polarity and disabled by the program signal in the second polarity; and
a second control differential stage coupled to the control terminal and connected to the input and output differential stages, the second control differential stage being configured to be disabled in the first polarity and enabled in the second polarity.

13. The feedback shift register of claim 12, wherein the first programmable latch is one of a plurality of programmable latches.

14. The feedback shift register of claim 12, further comprising:

a second programmable latch coupled to the first programmable latch, the second programmable latch being configured to assume a polarity opposite to the polarity assumed by the first programmable latch.

15. The feedback shift register of claim 12, wherein said first programmable latch further comprises:

a first current generator connected to the first control differential stage;

a first switch device connected to the first current generator and structured to receive the program signal, activate the first current generator in the first polarity, and deactivate the first current generator in the second polarity;

a second current generator connected to the second control differential stage; and a second switch device connected to the second current generator and structured to deactivate the second current generator in the second polarity and activate the second current generator in the second polarity.

16. A frequency divider comprising:

a plurality of programmable latches connected in a feedback shift register configuration, the plurality of programmable latches including a first programmable latch that includes a program input to receive a program signal and a control terminal to receive a clock signal, the first programmable latch being configured to select a polarity of the first programmable latch among two opposite polarities based on the program signal, and set the behavior of the first programmable latch in accordance with the selected polarity and the clock signal;

a configuration module structured to provide the program signal to the program input of the first programmable latch to modify a divisor parameter of the frequency divider;

an inverter placed between a sub-plurality of programmable latches of said plurality of programmable latches and a feedback sub-plurality of programmable latches of said plurality of programmable latches; and an input latch having a signal input connected to an output of the inverter and structured to assume a hold status in which provides a fixed output value to be fed to a consecutive programmable latch of the sub-plurality of programmable latches in an initialization step, wherein said first programmable latch comprises:
an input differential stage connected to a signal input;
an output differential stage connected to a signal output;
a first control differential stage coupled to the control terminal and connected to the input and output differential stages, the first control differential stage being configured to be enabled by the program signal in the first polarity and disabled by the program signal in the second polarity; and
a second control differential stage coupled to the control terminal and connected to the input and output differential stages, the second control differential stage being configured to be disabled in the first polarity and enabled in the second polarity.

17. The frequency divider of claim 16, wherein said plurality of programmable latches comprises:

a second programmable latch connected to the configuration module, the second programmable latch being configured to assume a polarity opposite to the polarity assumed by the first programmable latch.

18. The frequency divider of claim 16, wherein said first programmable latch further comprises:
- a first current generator connected to the first control differential stage;
- a first switch device connected to the first current generator and structured to receive the program signal, activate the first current generator in the first polarity, and deactivate the first current generator in the second polarity;
- a second current generator connected to the second control differential stage; and
- a second switch device connected to the second current generator and structured to deactivate the second current generator in the second polarity and activate the second current generator in the second polarity.

19. An electrical system comprising:
- a frequency divider including:
  - an input for a clock signal;
  - a plurality of programmable latches connected to said input in a feedback shift register configuration and structured to assume different polarities according to a selectable divisor parameter of the frequency divider;
  - an output for an output signal having a frequency equal to a frequency of the clock signal divided by said divisor parameter;
  - an inverter placed between a sub-plurality of programmable latches of said plurality of programmable latches and a feedback sub-plurality of programmable latches of said plurality of programmable latches; and
  - an input latch having a signal input connected to an output of the inverter and structured to assume a hold status in which provides a fixed output value to be fed to a consecutive programmable latch of the sub-plurality of programmable latches in an initialization step; and
- an apparatus having an input terminal to receive said output signal, wherein said first programmable latch comprises:
  - an input differential stage connected to a signal input;
  - an output differential stage connected to a signal output;
  - a first control differential stage coupled to the control terminal and connected to the input and output differential stages, the first control differential stage being configured to be enabled by the program signal in the first polarity and disabled by the program signal in the second polarity; and
  - a second control differential stage coupled to the control terminal and connected to the input and output differential stages, the second control differential stage being configured to be disabled in the first polarity and enabled in the second polarity.

20. The electrical system of claim 19, wherein:
- the frequency divider includes a configuration module structured to provide a program signal to modify the divisor parameter of the frequency divider; and
- said plurality of programmable latches comprises a first programmable latch that that includes a program input to receive the program signal and a control terminal to receive the clock signal, the first programmable latch being configured to select a polarity of the first programmable latch among two opposite polarities based on the program signal, and set the behavior of the first programmable latch in accordance with the selected polarity and the clock signal.

21. The electrical system of claim 20, wherein said plurality of programmable latches comprises:
- a second programmable latch connected to the configuration module, the second programmable latch being configured to assume a polarity opposite to the polarity assumed by the first programmable latch.

22. A feedback shift register comprising:
- a first programmable latch having:
  - a program input to receive a program signal; and
  - a control terminal to receive a clock signal, the first programmable latch being configured to select a polarity of the first programmable latch among two opposite polarities based on the program signal, and set the behavior of the first programmable latch in accordance with the selected polarity and the clock signal; and
- an inverter placed between a sub-plurality of programmable latches of said plurality of programmable latches and a feedback sub-plurality of programmable latches of said plurality of programmable latches; and
- an input latch having a signal input connected to an output of the inverter and structured to assume a hold status in which provides a fixed output value to be fed to a consecutive programmable latch of the sub-plurality of programmable latches in an initialization step, wherein said first programmable latch comprises:
  - an input differential stage connected to a signal input;
  - an output differential stage connected to a signal output;
  - a first control differential stage coupled to the control terminal and connected to the input and output differential stages, the first control differential stage being configured to be enabled by the program signal in the first polarity and disabled by the program signal in the second polarity; and
  - a second control differential stage coupled to the control terminal and connected to the input and output differential stages, the second control differential stage being configured to be disabled in the first polarity and enabled in the second polarity.

23. The feedback shift register of claim 22, wherein said first programmable latch further comprises:
- a first current generator connected to the first control differential stage;
- a first switch device connected to the first current generator and structured to receive the program signal, activate the first current generator in the first polarity, and deactivate the first current generator in the second polarity;
- a second current generator connected to the second control differential stage; and
- a second switch device connected to the second current generator and structured to deactivate the second current generator in the second polarity and activate the second current generator in the second polarity.

* * * * *

UNITED STATES PATENT AND TRADEMARK OFFICE
CERTIFICATE OF CORRECTION

PATENT NO. : 8,175,214 B2
APPLICATION NO. : 12/610105
DATED : May 8, 2012
INVENTOR(S) : Sebastian Zeller It is certified that error appears in the above-identified patent and that said Letters Patent is hereby corrected as shown below:

On Title page:

Item 73:
"STMicroelectronics Design & Application GmbH, Grassbrunn (DE)" should read,
--STMicroelectronics Design & Application GmbH, Grasbrunn (DE)--.

Column 9, Line 25:
"an output differential stage connected to a signal output:" should read, --an output differential stage connected to a signal output;--.

Column 9, Line 27:
"terminal and connected to the in and output" should read, --terminal and connected to the input and output--.

Column 9, Line 28:
"stages the first control differential stage" should read,
--stages, the first control differential stage--.

Column 9, Line 31:
"second polarity, and" should read, --second polarity; and--.

Column 10, Line 56:
"differential stages. the first control differential" should read, --differential stages, the first control differential--.

Signed and Sealed this
Twenty-fourth Day of July, 2012

David J. Kappos
*Director of the United States Patent and Trademark Office*